(12) United States Patent
Jeannin et al.

(10) Patent No.: US 11,570,865 B2
(45) Date of Patent: Jan. 31, 2023

(54) OPTOELECTRONIC CIRCUIT COMPRISING LIGHT EMITTING DIODES

(71) Applicant: Aledia, Echirolles (FR)

(72) Inventors: Olivier Jeannin, Grenoble (FR); Frédéric Mercier, Saint Nicolas de Macherin (FR); Pamela Rueda Fonseca, Fontaine (FR)

(73) Assignee: Aledia, Echirolles (FR)

( * ) Notice: Subject to any disclaimer, the term of this patent is extended or adjusted under 35 U.S.C. 154(b) by 0 days.

(21) Appl. No.: 17/057,078

(22) PCT Filed: May 17, 2019

(86) PCT No.: PCT/FR2019/051136
§ 371 (c)(1),
(2) Date: Nov. 19, 2020

(87) PCT Pub. No.: WO2019/229329
PCT Pub. Date: Dec. 5, 2019

(65) Prior Publication Data
US 2021/0144824 A1    May 13, 2021

(30) Foreign Application Priority Data
Jun. 1, 2018 (FR) ........................... 1800547

(51) Int. Cl.
*H01L 33/50* (2010.01)
*H05B 45/10* (2020.01)
(Continued)

(52) U.S. Cl.
CPC ............. *H05B 45/40* (2020.01); *H01L 33/24* (2013.01); *H01L 33/504* (2013.01); *H05B 45/10* (2020.01);
(Continued)

(58) Field of Classification Search
None
See application file for complete search history.

(56) References Cited

U.S. PATENT DOCUMENTS

| 8,395,332 B2 | 3/2013 | Lee et al. |
| 2010/0096977 A1 | 4/2010 | Lee et al. |
| (Continued) | | |

FOREIGN PATENT DOCUMENTS

| WO | WO 2016/108022 A1 | 9/2016 |
| WO | WO 2016/198348 A1 | 12/2016 |

OTHER PUBLICATIONS

International Preliminary Report on Patentability for International Application No. PCT/FR2019/051136, dated Dec. 10, 2020.
(Continued)

*Primary Examiner* — Anh Q Tran
(74) *Attorney, Agent, or Firm* — Wolf, Greenfield & Sacks, P.C.

(57) ABSTRACT optoelectronic circuit intended to receive a variable voltage containing an alternation of rising and falling phases. The optoelectronic circuit includes light-emitting diodes and a switching device capable of allowing or of interrupting the flowing of a current through each light-emitting diode. Each light-emitting diode is covered with a photoluminescent layer. The photoluminescent layer covering at least one of the light-emitting diodes includes at least one first luminophore having a first decay constant and at least one second luminophore having a second decay constant different from the first decay constant.

13 Claims, 3 Drawing Sheets

(51) Int. Cl.
  *H05B 45/30* (2020.01)
  *H05B 45/40* (2020.01)
  *H05B 45/20* (2020.01)
  *H05B 45/50* (2022.01)
  *H05B 45/48* (2020.01)
  *H01L 33/24* (2010.01)

(52) U.S. Cl.
  CPC ............ *H05B 45/20* (2020.01); *H05B 45/30* (2020.01); *H05B 45/48* (2020.01); *H05B 45/50* (2020.01)

(56) References Cited

U.S. PATENT DOCUMENTS

| | | | |
|---|---|---|---|
| 2012/0104957 A1* | 5/2012 | Yano | H05B 45/20 |
| | | | 315/201 |
| 2014/0264402 A1* | 9/2014 | Mei | F21K 9/64 |
| | | | 257/89 |
| 2014/0265921 A1 | 9/2014 | Collins | |
| 2020/0037409 A1* | 1/2020 | Peeters | H05B 45/44 |

OTHER PUBLICATIONS

PCT/FR2019/051136, Dec. 10, 2020, International Preliminary Report on Patentability.
International Search Report and Written Opinion for International Application No. PCT/FR2019/051136, dated Nov. 21, 2019.

* cited by examiner

OPTOELECTRONIC CIRCUIT COMPRISING LIGHT EMITTING DIODES

This application is a national stage filing under 35 U.S.C. § 371 of International Patent Application Serial No. PCT/FR2019/051136, filed May 17, 2019, which claims priority to French patent application FR18/00547, filed Jun. 1, 2018. The contents of these applications are incorporated herein by reference in their entireties.

BACKGROUND

The present disclosure concerns an optoelectronic circuit comprising light-emitting diodes.

DISCUSSION OF THE RELATED ART

For certain applications, it is desirable to be able to power an optoelectronic circuit comprising light-emitting diodes with an AC voltage, particularly a sinusoidal voltage, for example, the mains voltage.

A disadvantage of such an electronic circuit is that it may exhibit a variation, generally periodic, of the light intensity emitted by the optoelectronic circuit, for example comprising an alternation of first phases of light emission with a strong light intensity and of second phases of light emission with a low light intensity, or even of no light emission. An observer may perceive the second phases when their duration is too long.

Among the criteria used to characterize the variation of the light power emitted by an optoelectronic circuit powered with a variable voltage, the flicker ratio FR may be used. Calling MAX the maximum value of the emitted light intensity and MIN the minimum value of the emitted light intensity, flicker ratio FR is defined by the following relation (1):

$$FR = (MAX - MIN)/(MAX + MIN) \quad (1)$$

The flicker ratio may vary from 0% to 100%. It may be desirable for the flicker ratio to be as low as possible.

SUMMARY

An object of an embodiment is to overcome all or part of the disadvantages of the previously-described optoelectronic circuits comprising light-emitting diodes.

Another object of an embodiment is to decrease the flicker ratio of the optoelectronic circuit.

Another object of an embodiment is for the optoelectronic circuit to comprise a light-emitting diode control circuit having a simple structure.

Another object of an embodiment is for the optoelectronic circuit to be adapted to being powered with an AC voltage.

Thus, an embodiment provides an optoelectronic circuit intended to receive a variable voltage containing an alternation of rising and falling phases, the optoelectronic circuit comprising light-emitting diodes and a switching device capable of allowing or of interrupting the flowing of a current through each light-emitting diode, each light-emitting diode being covered with a photoluminescent layer, the photoluminescent layer covering at least one of the light-emitting diodes comprising at least one first luminophore having a first decay constant and at least one second luminophore having a second decay constant different from the first decay constant.

According to an embodiment, the first decay constant is greater than 2 ms.

According to an embodiment, the second decay constant is smaller than 2 ms.

According to an embodiment, the light-emitting diodes comprise a first light-emitting diode covered with a first photoluminescent layer and a second light-emitting diode covered with a second photoluminescent layer, the optoelectronic circuit comprising a first assembly comprising the first light-emitting diode covered with the first photoluminescent layer and capable of emitting a first radiation and a second assembly comprising the second light-emitting diode covered with the second photoluminescent layer and capable of emitting a second radiation, the first and second light-emitting diodes being capable of emitting a third radiation, the first and second photoluminescent layers each comprising the first luminophore capable of partly absorbing the third radiation and emitting a fourth radiation different from the third radiation, the relative intensity of the fourth radiation in the first radiation being different from the relative intensity of the fourth radiation in the second radiation.

According to an embodiment, the proportion in the light intensity of the light emitted by the first assembly due to the first luminophore is different by at least 2%, preferably by at least 5%, from the proportion in the light intensity of the light emitted by the second assembly due to the first luminophore.

According to an embodiment, the first photoluminescent layer comprises at least the second luminophore capable of partly absorbing the third radiation and of emitting a fifth radiation different from the third radiation.

According to an embodiment, the second photoluminescent layer comprises at least the second luminophore.

According to an embodiment, the relative intensity of the fifth radiation in the first radiation is different from the relative intensity of the fifth radiation in the second radiation.

According to an embodiment, the proportion in the light intensity of the light emitted by the first assembly due to the second luminophore is different by at least 2%, preferably by at least 5%, from the proportion in the light intensity of the light emitted by the second assembly due to the second luminophore.

According to an embodiment, the switching device is capable of connecting the light-emitting diodes according to a first order during each rising phase of the variable voltage and a second order during each falling phase of the variable voltage.

According to an embodiment, the switching device comprises at least one switch for each light-emitting diode, the switching device being capable of transmitting binary control signals for the turning-off or the turning-off of the switches.

According to an embodiment, the optoelectronic circuit comprises a current source and, for each light-emitting diode, the switch couples the current source to said light-emitting diode.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Figure 1:
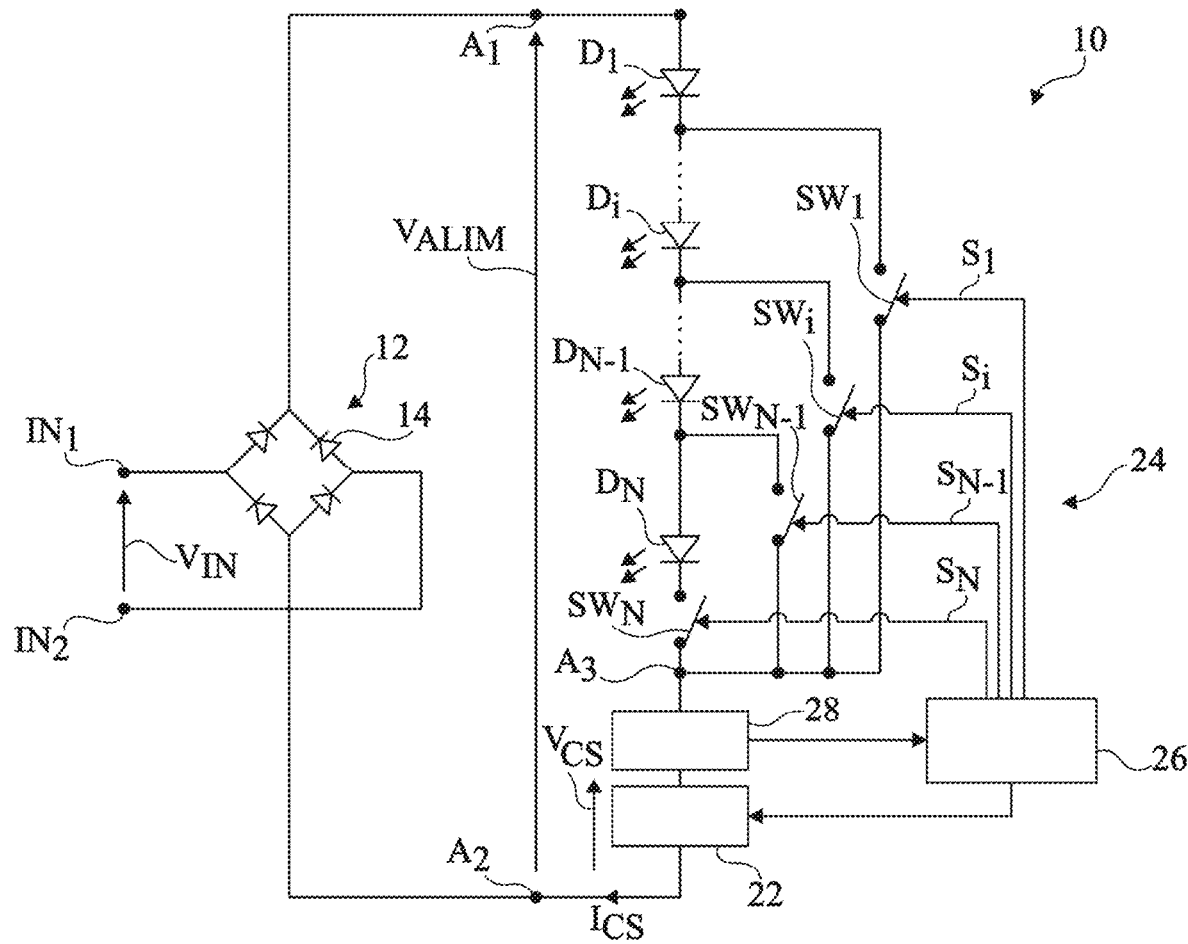
FIG. 1 shows an electric diagram of an embodiment of an optoelectronic circuit comprising light-emitting diodes.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for controlling the optoelectronic device described hereafter are within the abilities of those skilled in the art and are not described. The terms "substantially", "approximately", and "in the order of" are used herein to designate a tolerance of plus or minus 10% of the value in question. Further, a signal which alternates between a first constant state, for example, a low state, noted "0", and a second constant state, for example, a high state, noted "1", is called a "binary signal". The high and low states of different binary signals of a same electronic circuit may be different. In particular, the binary signals may correspond to voltages or to currents which may not be perfectly constant in the high or low state. Further, in the present description, the term "connected" is used to designate a direct electric connection, with no intermediate electronic component, for example, by means of a conductive track, and the term "coupled" or the term "linked" will be used to designate either a direct electric connection (then meaning "connected") or a connection via one or a plurality of intermediate components (resistor, capacitor, etc.).

FIG. 1 shows an embodiment of an optoelectronic circuit 10 comprising input terminals $IN_1$ and $IN_2$ having an AC voltage $V_{IN}$ applied therebetween. Optoelectronic circuit 10 further comprises a rectifying circuit 12 comprising a diode bridge 14, receiving voltage $V_{IN}$ and delivering a rectified voltage $V_{ALIM}$ between nodes $A_1$ and $A_2$. As a variant, circuit 10 may directly receive a rectified voltage, and it is then possible for the rectifying circuit not to be present. The potential at node $A_2$ may correspond to the low reference potential, for example 0 V, having the voltages of optoelectronic circuit 10 referenced thereto.

Optoelectronic circuit 10 comprises N series-connected assemblies of elementary light-emitting diodes, called general light-emitting diodes $D_i$ in the following description, where i is an integer in the range from 1 to N and where N is an integer in the range from 2 to 200. Each general light-emitting diode $D_1$ to $D_N$ comprises at least one elementary light-emitting diode covered with a photoluminescent layer. Preferably, each general light-emitting diode $D_1$ to $D_N$ is formed of the series and/or parallel assembly of at least two elementary light-emitting diodes covered with a photoluminescent layer. For each general light-emitting diode $D_i$, the photoluminescent layer is capable of converting a portion of the radiation emitted by the elementary light-emitting diode or the elementary light-emitting diodes of general light-emitting diode $D_i$ into a radiation at another wavelength. The general radiation emitted by general light-emitting diode $D_i$ comprises the radiation emitted by the elementary light-emitting diode or the elementary light-emitting diodes of general light-emitting diode $D_i$ and which is not converted by the photoluminescent layer, and the radiation emitted by the photoluminescent layer. As an example, when the elementary light-emitting diode emits blue light and the photoluminescent emits yellow light, the general spectrum of general light-emitting diode $D_i$ may be close to that of white light.

In the present example, the N general light-emitting diodes $D_i$ are series-connected, the cathode of general light-emitting diode $D_i$ being coupled to the anode of general light-emitting diode $D_{i+1}$, for i varying from 1 to N-1. The anode of general light-emitting diode $D_1$ is coupled, preferably connected, to node $A_1$. General light-emitting diodes $D_i$, with i varying from 1 to N, may comprise the same number of elementary light-emitting diodes or different numbers of elementary light-emitting diodes.

Optoelectronic circuit 10 comprises a current source 22 having a terminal coupled to node $A_2$ and having its other terminal coupled to a node $A_3$. The cathode of general light-emitting diode $D_N$ is coupled to node $A_3$. Call $V_{CS}$ the voltage across current source 22 and $I_{CS}$ the current absorbed by current source 22. Optoelectronic circuit 10 may comprise a circuit, not shown, which supplies a reference voltage for the power supply of the current source, possibly obtained from voltage $V_{ALIM}$. Current source 22 may have any structure and may in particular correspond to an impedance, for example, a resistor. Current source 22 may be continuously controlled by a circuit external to optoelectronic circuit 10.

Circuit 10 comprises a light-emitting diode switching device 24. As an example, device 24 comprises N controllable switches $SW_1$ to $SW_N$. Each switch $SW_i$, with i varying from 1 to N, is assembled between node $A_3$ and the cathode of general light-emitting diode $D_i$. Each switch $SW_i$, with i varying from 1 to N, is controlled by a signal $S_i$ supplied by a control unit 26. Control unit 26 may be totally or partly formed by a dedicated circuit or may comprise a microprocessor or a microcontroller capable of executing a series of instructions stored in a memory. As an example, signal $S_i$ is a binary signal and switch $SW_i$ is off when signal $S_i$ is in a first state, for example, the low state, and switch $SW_i$ is on when signal $S_i$ is in a second state, for example, the high state. Each $SW_i$ is, for example, made of at least one transistor, particularly, an enrichment or depletion metal-oxide gate field-effect transistor or MOS transistor. Signal $S_i$ then is the gate control signal of transistor $SW_i$. According to an embodiment, each switch $SW_i$ comprises an N-channel MOS transistor, for example, having an N channel, having its drain connected to the cathode of general light-emitting diode $D_i$, having its source coupled to node $A_3$, and having its gate receiving signal $S_i$. According to another embodiment, switch $SW_i$ comprises two transistors MOS, for example, with an N channel, between the cathode of general light-emitting diode $D_i$ and node $A_3$, the transistor connected to general light-emitting diode $D_i$ being a cascade-assembled high-voltage transistor and the transistor connected to node $A_3$ being a low-voltage transistor controlled by signal $S_i$. This advantageously enables to increase the switching speed of switch $SW_i$.

Optoelectronic circuit 10 comprises one or a plurality of sensors connected to control unit 26. It may be a single sensor, for example, a sensor capable of measuring voltage $V_{ALIM}$ or the current flowing between terminals $IN_1$ and $IN_2$, or a plurality of sensors, where each sensor may be associated with a general light-emitting diode $D_i$. As an example, a single sensor 28 has been shown in FIG. 1.

Control unit 26 is capable of controlling the turning on or the turning off of switches $SW_i$, with i varying from 1 to N-1, according to the value of voltage $V_{ALIM}$ according to a sequence based on the measurement of at least a physical parameter, for example, at least one current or one voltage. As an example, the turning off and the turning on of switches $SW_i$ may be controlled by control unit 26 based on the signals supplied by sensor 28 or the sensors. As a variation, the turning off and the turning on of switch $SW_i$ may be controlled based on the measurement of the voltage at the cathode of each general light-emitting diode $D_i$. As a variation, the turning off and the turning on of switch $SW_i$ may be controlled based on the measurement of voltage $V_{ALIM}$ or on the measurement of the voltage at the cathode of each general light-emitting diode $D_i$. The number of switches $SW_1$ to $SW_N$ may vary according to the turn-off and turn-on sequence implemented by control unit 26. As an example, switch $SW_N$ may be absent. The order in which switches $SW_i$ are turned on and off is determined by the structure of optoelectronic circuit 10 and is repeated for each cycle of power supply voltage $V_{ALIM}$.

An example of operation of optoelectronic circuit 10 is the following, considering that switches $SW_i$ are perfect. Control unit 26 is capable of controlling the turning on or off of switches $SW_i$, with i varying from 1 to N-1, according to the value of voltage $V_{CS}$ across current source 22. To achieve this, control circuit 26 may be capable of comparing voltage $V_{CS}$ with at least one threshold. As an example, voltage $V_{ALIM}$ delivered by rectifying bridge 12 is a rectified sinusewave voltage comprising a succession of cycles having voltage $V_{ALIM}$ increasing from the zero value, crossing a maximum value, and decreasing to the zero value, in each of them. At the beginning of each cycle, all switches $SW_i$, with i varying from 1 to N-1, are turned on. Thereby, general light-emitting diodes $D_2$ to $D_N$ are shorted and voltage $V_{ALIM}$ distributes between general light-emitting diode $D_1$ and current source 22. Voltage $V_{ALIM}$ rises from the zero value. When the voltage across general light-emitting diode $D_1$ exceeds its threshold voltage, general light-emitting diode $D_1$ turns on and starts emitting light. The voltage across general light-emitting diode $D_1$ is then substantially fixed and voltage $V_{CS}$ keeps on increasing along with voltage $V_{ALIM}$. When voltage $V_{CS}$ exceeds a threshold, unit 26 controls switch $SW_1$ to the off state. Voltage $V_{ALIM}$ then distributes between general light-emitting diodes $D_1$ and $D_2$ and current source 22. When the voltage across light-emitting diode $D_2$ exceeds its threshold voltage, general light-emitting diode $D_2$ turns on and starts emitting light. The voltage across general light-emitting diode $D_2$ is then substantially fixed and voltage $V_{CS}$ keeps on increasing along with voltage $V_{ALIM}$. When voltage $V_{CS}$ exceeds a threshold, unit 28 controls switch $SW_2$ to the off state. These steps are repeated until switch $SW_{N-1}$ is turned off. All the light-emitting diodes are then on. When voltage $V_{ALIM}$ decreases from its maximum value, switches $SW_{N-1}$ to $SW_1$ are successively turned on in this order as voltage $V_{ALIM}$ decreases, for example, each time voltage $V_{CS}$ decreases below a threshold.

The elementary light-emitting diodes of optoelectronic circuit 10 may have a two-dimensional structure or a three-dimensional structure. The active layer of an elementary light-emitting diode is the layer from which most of the radiation supplied by the elementary light-emitting diode is emitted. The light-emitting diode is said to have a two-dimensional structure when the active layer is formed on a planar semiconductor layer and the light-emitting diode is said to have a three-dimensional structure when the active layer is formed on at least one three-dimensional semiconductor element, for example, a microwire or a nanowire.

Figure 2:
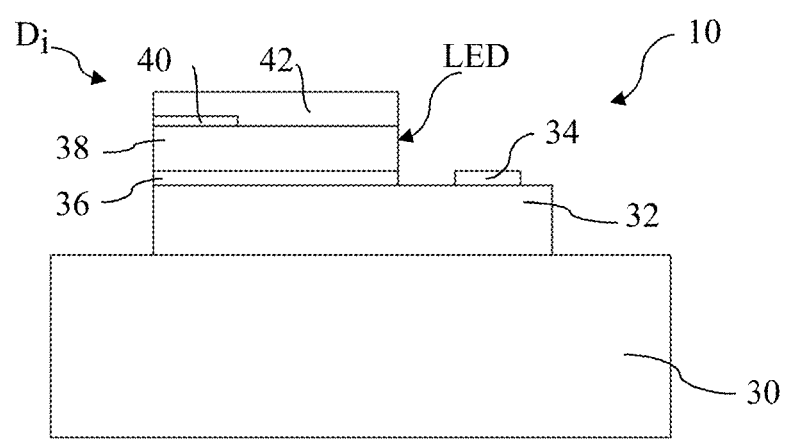
FIGS. 2 and 3 are partial simplified cross-section views of embodiments of a light-emitting diode of the optoelectronic circuit of FIG. 1.

FIG. 2 shows an embodiment of a general light-emitting diode $D_i$ of optoelectronic circuit 10, general light-emitting diode $D_i$ comprising an elementary light-emitting diode LED with a two-dimensional structure.

Optoelectronic circuit 10 comprises, from bottom to top in FIG. 2:

a substrate 30;

a first semiconductor layer 32 made of a doped semiconductor material of a first conductivity type;

a first electrode 34 in contact with first semiconductor layer 32;

an active layer 36 covering semiconductor layer 32;

a second semiconductor layer 38 made of the doped semiconductor material of a second conductivity type opposite to the first conductivity type, covering active layer 36;

a second electrode 40 in contact with second semiconductor layer 38; and a photoluminescent layer 42 covering second semiconductor layer 38.

Figure 3:
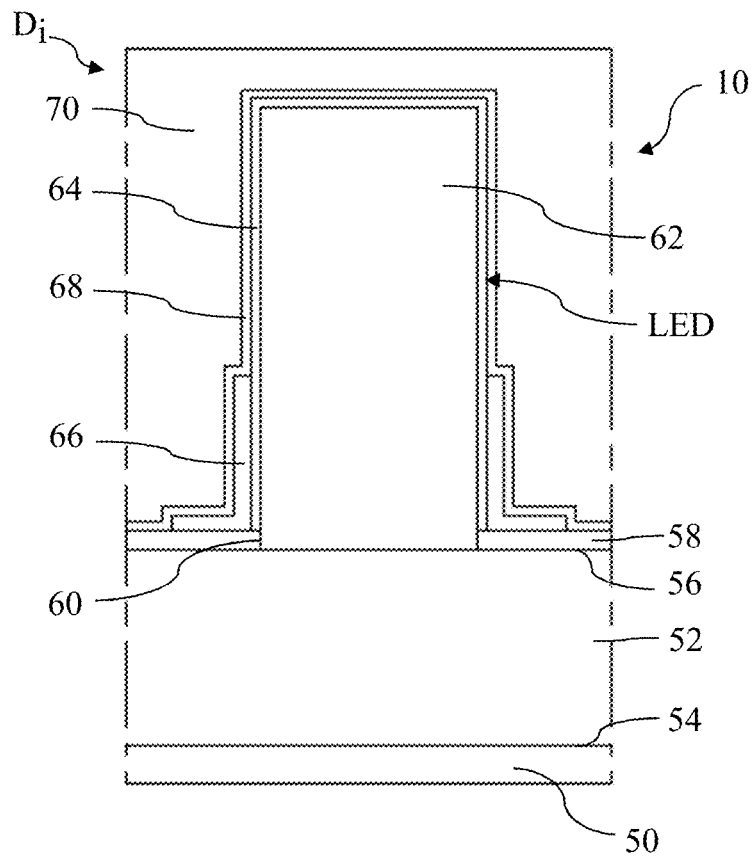

FIG. 3 shows an embodiment of a general light-emitting diode $D_i$ of optoelectronic circuit 10, general light-emitting diode $D_i$ comprising an elementary light-emitting diode LED having a three-dimensional structure. Such optoelectronic circuits are for example described in French patent applications FR 2995729 and FR 2997558.

Optoelectronic circuit 10 comprises, from bottom to top in FIG. 3:

a first electrode 50;

a substrate 52, for example, semiconductor, comprising parallel surfaces 54 and 56, surface 54 being in contact with electrode 50;

an electrically-insulating layer 58 covering surface 56 and comprising an opening 60;

a three-dimensional semiconductor element 62, for example, a nanowire, a microwire, or a pyramid, extending from substrate 52 into opening 60, a layer made of a material favoring the growth of three-dimensional semiconductor element 62 capable of being interposed between three-dimensional semiconductor element 62 and substrate 52;

a shell 64 covering the external wall of each wire 62, shell 64 comprising the active layer;

an electrically-insulating layer 66 covering the periphery of a lower portion of each shell 64;

an electrically-conductive layer 68 transparent to the radiation emitted by the active layer and covering shell 64; and an electrically-insulating photoluminescent layer 70 covering the entire structure.

According to an embodiment, semiconductor layers 32, 38 and three-dimensional semiconductor element 62 are at least partly formed from at least one semiconductor material. The semiconductor material is selected from the group comprising III-V compounds, II-VI compounds, or group-IV semiconductors or compounds.

According to an embodiment, semiconductor layers 32, 38 and three-dimensional element 62 comprise a semiconductor nitride of formula $Al_xIn_yGa_{(1-x-y)}N$ (with x varying from 0 to 1, y varying from 0 to 1, and x+y varying from 0 to 1) capable of being doped with an N-type or P-type dopant.

The method of growing semiconductor layers 32, 38 and three-dimensional semiconductor element 62 may be a method such as chemical vapor deposition (CVD) or metalorganic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), or hydride vapor phase epitaxy (HVPE) may be used. However, electrochemical processes may be used, for example, chemical bath deposition (CBD), hydrothermal processes, liquid aerosol pyrolysis, or electrodeposition.

According to an embodiment, the active layer may comprise means for confining the electric charge carriers, such as a single quantum well or multiple quantum wells. The active layer may comprise a plurality of layers of materials according to formula $In_xGa_{1-x}N$ (with x varying from 0 to 1) where the energy of the bandgap is adjusted according to the proportion of indium (In). The active layer may comprise multiple quantum wells comprising a stack of semiconductor layers forming an alternation of quantum wells and of barrier layers, for example, an InGaN/GaN structure.

According to an embodiment, the active layer of the elementary light-emitting element emits blue light, for example, having a wavelength in the range from 430 nm to 480 nm.

Each general light-emitting diode $D_i$ comprises at least one elementary light-emitting diode covered with a photoluminescent layer, for example, as shown in FIGS. 2 and 3. Preferably, the photoluminescent layer is common the all the elementary light-emitting diodes of a same general light-emitting diode $D_i$.

Each photoluminescent layer may comprise luminophores. The photoluminescent layer may comprise a layer of a bonding medium, for example, a silicone resin or an epoxy resin, having a luminophore powder embedded therein. The photoluminescent layer of at least one of the light-emitting diodes may comprise luminophores of different types. Preferably, the photoluminescent layers of all the light-emitting diodes comprise luminophores of different types. The photoluminescent layer of at least one of the light-emitting diodes may correspond to a single layer comprising luminophores of different types. As a variant, the photoluminescent layer of at least one of the light-emitting diodes may comprise a stack of photoluminescent sub-layers, each photoluminescent sub-layer comprising a luminophore of a given type.

Examples of luminophores capable of emitting a red light radiation, that is, with a wavelength in the range from 625 nm to 780 nm, comprise a nitride-type luminophore of formula $MAlSiN_x$:Re (with x varying from 1 to 5) or a luminophore of formula MD:Re with:

M selected from the group comprising Ba, Sr, Ca, and Mg;

D selected from the group comprising S, Se, and Te; and

Re selected from the group comprising Eu, Y, La, Ce, Nd, Pm, Sm, Gd, Tb, Dy, Ho, Er, Tm, Yb, Lu, F, Cl, Br, and I.

Other examples of luminophores capable of emitting a red light radiation are: $CaMg_2Al_{16}O_{27}$:$Mn^{4+}$ and fluoride-type luminophores, particularly $K_2SiF_6$:$Mn^{4+}$, $Na_2SiF_6$:$M^{4+}$, $Cs_2SiF_6$:$Mn^{4+}$, $K_2GeF_6$:$M^{4+}$, $Na_2GeF_6$:$M^{4+}$, $Cs_2GeF_6$:$M^{4+}$, $K_2ZrF_6$:$Mn^{4+}$, $Na_2ZrF_6$:$Mn^{4+}$, $Cs_2ZrF_6$:$Mn^{4+}$, $K_2SnF_6.H_2O$:$Mn^{4+}$, $Na_2SnF_6$:$Mn^{4+}$, $Cs_2SnF_6$:$Mn^{4+}$, $K_2TiF_6$:$Mn^{4+}$, $Na_2TiF_6$:$Mn^{4+}$, $Cs_2TiF_6$:$Mn^{4+}$, $BaSiF_6$:$Mn^{4+}$, $Na_2GeF_6$:$Mn^{4+}$, $ZnSiF_6.H_2O$: $Mn^{4+}$.

Examples of luminophores capable of emitting a green light radiation, that is, with a wavelength in the range from 500 nm to 580 nm, comprise silicate-type luminophores of formula $M_2SiO_4$:Re, sulfide-type luminophores of formula $MA_2D_4$:Re, luminophores of formula β-SiAlON:Re, and oxide-type luminophores of formula MA'2O4:Re' with:

M selected from the group comprising Ba, Sr, Ca, and Mg;

A selected from the group comprising Ga, Al, and In;

D selected from the group comprising S, Se, and Te;

A' selected from the group comprising Sc, Y, Gd, La, Lu, Al, and In;

Re selected from the group comprising Eu, Y, La, Ce, Nd, Pm, Sm, Gd, Tb, Dy, Ho, Er, Tm, Yb, Lu, F, Cl, Br, and I; and Re' selected from the group comprising Ce, Nd, Pm, Sm, Tb, Dy, Ho, Er, Tm, Yb, F, Cl, Br, and I.

Other examples of luminophores capable of emitting a green light radiation are the luminophores described in U.S. Pat. No. 9,085,732, particularly luminophores of formula $Ca_{8-x-y}A_xEu_yMg_{1-m-n}B_mMn_n(Si_{1-s}C_sO_4)_4R_2$, where A is at least a divalent cation comprising Ca, St, Ba, individually or in combinations, or a combination of +1 and +3 cations, B is Zn or Cd, or a divalent metal ion other than an alkaline earth, present individually or in combinations, C is a +3, +4, or +5 cation, comprising at least one of the following elements: Ge, Al, B, Gd, Ga, and N, individually or in combinations, and R is a −1, −2, −3 anion, including F, Cl, Br, I, individually or in combinations. The value of the sum of parameters x+y is any value smaller than approximately 8, and the value of the sum of parameters m+n is any value smaller than approximately 1. The value of parameter s is a value smaller than approximately 1. An example is the $Ca_{8-x}Eu_xMg_{1-y}Mn_y(SiO_4)_4Cl_2$ compound, where x varies by from approximately 0.16 to 0.24 and y varies by from approximately 0.3 to 0.5.

Other examples of luminophores capable of emitting a green light radiation are the luminophores described in the publication entitled "New single-phase, white light-emitting phosphors based on δ-$Gd_2Si_2O_7$ for solid state lighting" of A. J. Fernández-Carrión, M. Ocaña, J. García-Sevillano, E. Cantelar, and A. I. Becerro (Journal of Physical Chemistry C, 2014, 118 (31), pp. 18035-18043), particularly δ-$Gd_2Si_2O_7$:$Eu^{3+}$,$Tb^{3+}$.

According to an embodiment, at least part of the luminophores may correspond to quantum dots. A quantum dot is a nanometer-range crystal having a core and a shell. The core of the quantum dot may have a size varying from 2 nm to 100 nm. By the adjusting of the size of the core, the quantum dot may form a photoluminescent material emitting different colors, particularly blue, yellow, green, and red. The core-shell structure forming the quantum dot may be formed by a heterojunction of at least two semiconductors selected from the II-VI group (particularly ZnS, ZnSe, ZnTe, CdS, CdSe, CdTe, HgS, HgSe, HgTe, MgTe), the III-V group (particularly GaN, GaP, GaAs, GaSb, InN, InP, InAs, InSb, AlAs, AlP, AlSb, AlS), or the IV group (particularly Ge, Si, Pb). An organic ligand using an oleic acid-type compound may be formed in the outer shell of the quantum dot to block the molecular bonds of the outer shell and prevent the agglomeration of the quantum dots, increase the dispersion of the quantum dots in a resin, such as a silicone resin or an epoxy resin, and/or improve the photoluminescence performance.

According to an embodiment, at least one of the photoluminescent layers of the light-emitting diodes comprises a type of luminophore having a decay constant greater than a few milliseconds, for example, 2 ms, preferably 5 ms. The decay constant of a luminophore is the time during which the light intensity emitted by the luminophore decreases by 1/e after the stopping of the incident radiation absorbed by the luminophores. Among the previously-described luminophores, examples of luminophores having a decay constant greater than a few milliseconds particularly are δ-$Gd_2Si_2O_7$:$Eu^{3+}$,$Tb^{3+}$ and $K_2SiF_6$:$Mn^{4+}$.

According to an embodiment, the proportion by weight of luminophore having a decay constant greater than a few milliseconds is different for the photoluminescent layers of at least two general light-emitting diodes.

The inventors have shown that a decrease in the flicker ratio FR of the optoelectronic circuit can then be obtained. Further, the decrease in the flicker ratio of the optoelectronic circuit may advantageously be obtained while keeping the same color point perceived by an observer and the same luminous efficiency.

According to an embodiment, at least one of the photoluminescent layers of the light-emitting diodes comprises a type of luminophore having a decay constant smaller than 2 ms, preferably smaller than 1 ms, more preferably smaller than 0.5 ms. Among the previously-described luminophores, examples of luminophores having a decay constant smaller than 1 ms are SiAlON:$Eu^{2+}$. All the previously-described examples of quantum dots have a decay constant smaller than 1 ms.

According to an embodiment, the proportion by weight of the luminophore having a decay constant smaller than 1 ms is different for the photoluminescent layers of at least two general light-emitting diodes.

The fact for the compositions of the photoluminescent layers for at least to general light-emitting diodes $D_i$ and $D_j$ to be different, with i different from j, may simplify the photoluminescent layer manufacturing method to reach a given color perceived by an observer.

According to an embodiment, for at least two general light-emitting diodes $D_i$ and $D^j$ with i different from j, having their photoluminescent layers each comprising a first luminophore having a decay constant greater than 2 ms, the proportion in the light intensity of the light emitted by the general light-emitting diode $D_j$ due to the first luminophore is different by at least 2%, preferably, by at least 5%, from the proportion in the light intensity of the light emitted by general light-emitting diode $D_i$ due to the first luminophore.

According to an embodiment, for at least two general light-emitting diodes $D_i$ and $D_j$, with i different from j, the proportion in the light intensity of the light emitted by general light-emitting diode $D_i$ due to the elementary light-emitting diode or to the elementary light-emitting diodes of general light-emitting diode $D_i$, is different by at least 2%, preferably, by at least 5%, from the proportion in the light intensity of the light emitted by general light-emitting diode $D_j$ due to the elementary light-emitting diode or to the elementary light-emitting diodes of general light-emitting diode $D_j$.

According to an embodiment, for at least two general light-emitting diodes $D_i$ and $D_j$, with i different from j, having their luminophore layers each comprising a second luminophore having a decay constant greater smaller than 1 ms in addition to the first luminophore having a decay constant greater than 2 ms, the proportion in the light intensity of the light emitted by the general light-emitting diode $D_i$ due to the second luminophore is different by at least 2%, preferably, by at least 5%, from the proportion in the light intensity of the light emitted by general light-emitting diode $D_j$ due to the second luminophore.

Figure 4:
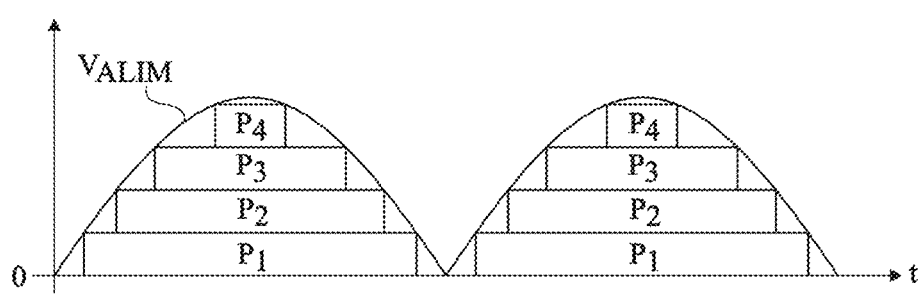
FIG. 4 is a timing diagram showing the phases of light emission of the light-emitting diodes of the optoelectronic circuit of FIG. 1.

FIG. 4 is a timing diagram of power supply voltage $V_{ALIM}$ in the case where AC voltage $V_{IN}$ corresponds to a sine-wave voltage and for an example in the case where optoelectronic circuit 10 comprises four light-emitting diodes $D_1$, $D_2$, $D_3$, and $D_4$. FIG. 4 schematically shows phases $P_1$, $P_2$, $P_3$, and $P_4$. Phase $P_1$ shows the conduction phase of general light-emitting diode $D_1$. Phase $P_2$ shows the conduction phase of general light-emitting diode $D_2$. Phase $P_3$ shows the conduction phase of general light-emitting diode $D_3$. Phase $P_4$ shows the conduction phase of general light-emitting diode $D_4$.

As appears in FIG. 4, the durations of emission of the general light-emitting diodes $D_i$ are not identical. The properties, and particularly the color, of the light perceived by an observer of optoelectronic circuit 10 will particularly depend on the different compositions of the luminophore layers of the general light-emitting diodes and on the different durations of emission of each general light-emitting diode.

First and second simulations have been performed. For the simulations, optoelectronic circuit 10 comprised two general light-emitting diodes $D_1$ and $D_2$. Each general light-emitting diode comprised the same number of elementary light-emitting diodes which all emitted blue light at a 455-nm wavelength. The photoluminescent layer of each general light-emitting diode comprised a luminophore capable of emitting red light, for example corresponding to a color point of chromatic coordinates x=0.681 and y=0.296 in color space CIE 1931, called red luminophore, and having a 8-ms decay constant. The photoluminescent layer of each general light-emitting diode may further comprise a luminophore capable of emitting green light, for example corresponding to a color point of chromatic coordinates x=0.356 and y=0.576 in color space CIE 1931, called green luminophore, and having a decay constant smaller than 1 ms.

A first comparison simulation has been performed, where the luminophore layers of the two general light-emitting diodes $D_1$ and $D_2$ had the same composition. The proportions of red luminophores and of green luminophores were such that, in steady state during each emission phase, the radiation of the light emitted by each general light-emitting diode and perceived by an observed comprised 15% of blue light emitted by the elementary light-emitting diodes, 40% of red light emitted by the red luminophores, and 45% of green emitted by the green luminophores.

Figure 5:
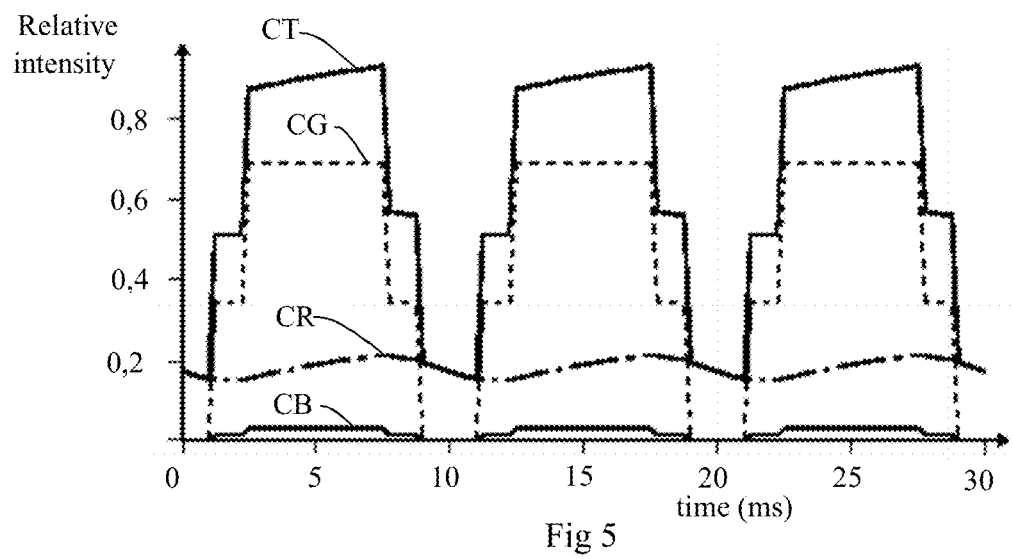
FIGS. 5 and 6 show curves of the time variation, obtained by simulation, of the relative light intensities emitted by the light-emitting diodes and the luminophores of the luminophore layers of the optoelectronic circuit of FIG. 1 for different compositions of the luminophore layers.

FIG. 5 shows, for the first simulation, curves of the time variation of the relative light intensity of the light emitted by optoelectronic circuit 10 (curve CT) with the proportions of blue light (curve CB), of red light (curve CR), and of green light (curve CG) during three variation cycles of voltage $V_{ALIM}$.

The color perceived by an observer corresponded to warm white at 3,100 K. The flicker ratio of optoelectronic circuit 10 for the first simulation was 72%. The luminous efficiency of optoelectronic circuit 10, which is equal to the ratio of the light flow emitted by optoelectronic circuit 10 to the electric power consumed by optoelectronic circuit 10, was 100 1 m/W. The presence of luminophores having a decay constant greater than 2 ms enables to carry on the emission of a radiation by optoelectronic circuit 10 even when no elementary light-emitting diode is activated. This enables to decrease the flicker ratio of optoelectronic circuit 10.

A second simulation has been performed, where the luminophore layers of the two general light-emitting diodes $D_1$ and $D_2$ had different compositions. The proportions of red luminophores and of green luminophores were such that, in steady state, the light intensity of the light emitted by general light-emitting diode $D_1$ comprised 12% of blue light, 14% of red light, and 74% of green light, and that the light intensity of the light emitted by general light-emitting diode $D_2$ comprised 20% of blue light, 80% of red light, and 0% of green light.

Figure 6:
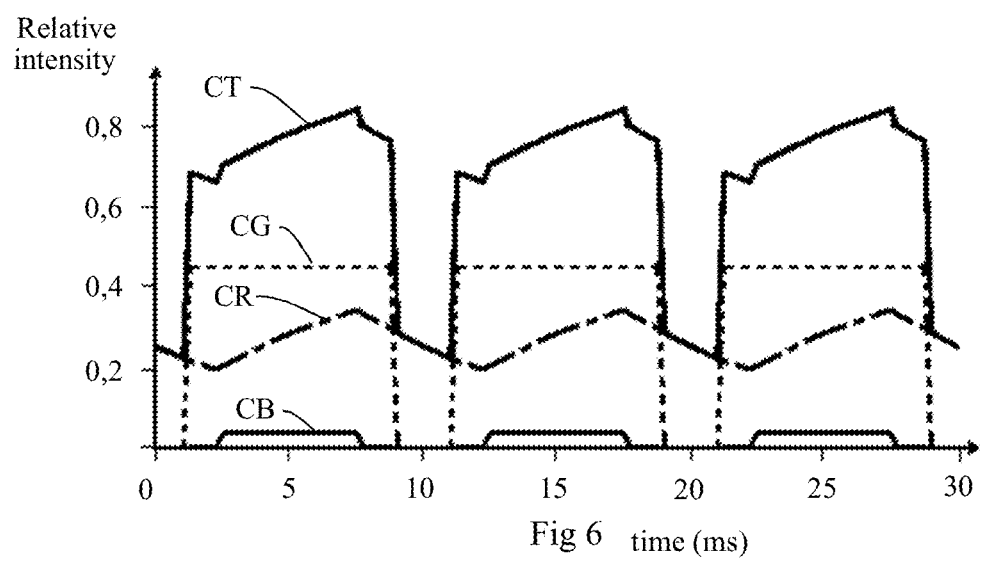

FIG. 6 shows variation curves similar to FIG. 5 for the second simulation.

The color perceived by an observer corresponded to warm white at 3,100 K. The flicker ratio of optoelectronic circuit 10 for the second simulation was 57.4%. The luminous efficiency of optoelectronic circuit 10 was 100 1 m/W.

The flicker ratio of the optoelectronic circuit has thus been decreased while keeping the same color point perceived by an observer and the same luminous efficiency.

Specific embodiments have been described. Various alternations and modifications will occur to those skilled in the art. In particular, although embodiment have been described for a specific electric diagram of optoelectronic circuit 10, it should be clear that the optoelectronic circuit, and in particular light-emitting diode switching device 24, may have a structure different from the structure shown in FIG. 1. As an example, the structure of the optoelectronic circuit may correspond to that described in patent applications WO2016/001201, WO2016/005448, and WO2016/108022.

Various embodiments with different variations have been described hereabove. It should be noted that those skilled in the art may combine these various embodiments and variations without showing any inventive step.

The invention claimed is:

1. An optoelectronic circuit intended to receive a variable voltage containing an alternation of rising and falling phases, the optoelectronic circuit comprising light-emitting diodes and a switching device capable of allowing or of interrupting the flowing of a current through each light-emitting diode, the light-emitting diodes comprising a first light-emitting diode covered with a first photoluminescent layer and a second light-emitting diode covered with a second photoluminescent layer, the optoelectronic circuit comprising a first assembly comprising the first light-emitting diode covered with the first photoluminescent layer and capable of emitting a first radiation and a second assembly comprising the second light-emitting diode covered with the second photoluminescent layer and capable of emitting a second radiation, the first and second light-emitting diodes being capable of emitting a third radiation, the first and second photoluminescent layers each comprising at least one first luminophore having a first decay constant and capable of partly absorbing the third radiation and emitting a fourth radiation different from the third radiation, at least one of the first and second photoluminescent layers further comprising at least one second luminophore having a second decay constant less than the first decay constant, the switching device being adapted to switch on the first light-emitting diode before the second light-emitting diode during each rising phase of the variable voltage and to switch off the first light-emitting diode after the second light-emitting diode during each falling phase of the variable voltage, wherein the relative intensity of the fourth radiation in the first radiation is less than the relative intensity of the fourth radiation in the second radiation.

2. The optoelectronic circuit according to claim 1, wherein the first decay constant is greater than 2 ms.

3. The optoelectronic circuit according to claim 1, wherein the second decay constant is smaller than 2 ms.

4. The optoelectronic circuit according to claim 1, wherein the proportion in the light intensity of the light emitted by the first assembly due to the first luminophore is different by at least 2%, preferably by at least 5%, from the proportion in the light intensity of the light emitted by the second assembly due to the first luminophore.

5. The optoelectronic circuit according to claim 1, wherein the first photoluminescent layer comprises at least the second luminophore capable of partly absorbing the third radiation and of emitting a fifth radiation different from the third radiation.

6. The optoelectronic circuit according to claim 5, wherein the second photoluminescent layer comprises at least the second luminophore.

7. The optoelectronic circuit according to claim 5, wherein the relative intensity of the fifth radiation in the first radiation is different from the relative intensity of the fifth radiation in the second radiation.

8. The optoelectronic circuit according to claim 7, wherein the proportion in the light intensity of the light emitted by the first assembly due to the second luminophore is different by at least 2%, preferably by at least 5%, from the proportion in the light intensity of the light emitted by the second assembly due to the second luminophore.

9. The optoelectronic circuit according to claim 1, wherein the switching device is capable of connecting the light-emitting diodes according to a first order during each rising phase of the variable voltage and a second order during each falling phase of the variable voltage.

10. The optoelectronic circuit according to claim 1, wherein the switching device comprises at least one switch for each light-emitting diode, the switching device being capable of transmitting binary control signals for the turning off or the turning on of the switches.

11. The optoelectronic circuit according to claim 10, comprising a current source and wherein, for each light-emitting diode, the switch couples the current source to said light-emitting diode.

12. The optoelectronic circuit according to claim 2, wherein the second decay constant is smaller than 2 ms.

13. The optoelectronic circuit according to claim 4, wherein the first photoluminescent layer comprises at least the second luminophore capable of partly absorbing the third radiation and of emitting a fifth radiation different from the third radiation.

\* \* \* \* \*